US005659316A

United States Patent [19]

Stierli

[11] Patent Number: 5,659,316

[45] Date of Patent: Aug. 19, 1997

[54] SIGNAL EVALUATION CIRCUIT FOR A MOTION DETECTOR

[75] Inventor: Peter Stierli, Stäfa, Switzerland

[73] Assignee: Cerberus AG, Mannedorf, Switzerland

[21] Appl. No.: 545,685

[22] PCT Filed: Mar. 16, 1995

[86] PCT No.: PCT/CH95/00058

§ 371 Date: Nov. 15, 1995

§ 102(e) Date: Nov. 15, 1995

[87] PCT Pub. No.: WO95/26017

PCT Pub. Date: Sep. 28, 1995

[30] Foreign Application Priority Data

Mar. 24, 1994 [CH] Switzerland .......................... 00882/94

[51] Int. Cl.$^6$ ...................................................... H03M 3/00

[52] U.S. Cl. ........................................... 341/143; 341/155

[58] Field of Search .................................... 341/143, 155, 341/140; 128/782

[56] References Cited

U.S. PATENT DOCUMENTS 5,163,438 11/1992 Gordon et al. .......................... 128/677

*Primary Examiner*—Brian K. Young

*Attorney, Agent, or Firm*—Brumbaugh, Graves, Donohue & Raymond

[57] ABSTRACT

The motion detector generates a sensor signal (SS) which contains a direct current portion and an alternating current portion. The signal evaluation circuit (3) contains means for filtering out the direct current portion, an analogue-to-digital converter (4) and an amplifier for the alternating current portion of the sensor signal. The analogue-to-digital converter (4) is provided for the direct digitizing of the entire sensor signal (SS) and the means for filtering out the direct current portion are formed by a digital high-pass filter (5) connected downstream of the analogue-to-digital converter.

17 Claims, 1 Drawing Sheet

SIGNAL EVALUATION CIRCUIT FOR A MOTION DETECTOR

BACKGROUND OF THE INVENTION

The present invention relates to a signal evaluation circuit for a motion detector which contains a sensor and whose sensor signal contains a relatively large direct current portion and a small alternating current portion, having means for filtering out the direct current portion, having an analogue-to-digital converter and having an amplifier for the alternating current portion of the sensor signal.

The sensor signal of motion detectors of this type is composed of an highly erratic and temperature-dependent direct current component and of an alternating current portion. The direct current portion which makes no contribution to the useful signal cannot be anticipated and is unstable for a relatively long period of time, and the alternating current portion which delivers the useful signal in order to trigger the alarm is at a level of approximately one per thousand of the direct current portion and therefore has to be amplified to a correspondingly intensive degree. Generally the signal evaluation circuit contains a series of capacitors which act as high-pass filters and gradually filter out the direct current portion. The remaining alternating current signal is then digitized and amplified. Owing to the low useful frequencies, the filtering process requires large coupling-electrolyte capacitors which are not only expensive and problematic from the electrical point of view but which also cannot be integrated and thus render it impossible to construct the evaluation circuit as an integrated circuit (IC) which would be desirable for reasons of cost.

SUMMARY OF THE INVENTION

The invention is now to indicate an evaluation circuit which is economical and robust and which can be constructed in the form of an integrated circuit, preferably in the form of a system-integrated switching circuit (ASIC).

In accordance with the invention this object is achieved in that the analogue-to-digital converter is provided for the direct digitizing of the entire sensor signal and in that the means for filtering out the direct current portion are formed by a digital high-pass filter connected downstream of the analogue-to-digital converter.

A first preferred embodiment of the signal evaluation circuit according to the invention is characterized in that the analogue-to-digital converter is in the form of a sigma-delta structure. In accordance with a second preferred embodiment the analogue-to-digital converter contains a sigma-delta loop and a decimator connected downstream of the latter. In accordance with a further preferred embodiment this decimator is in the form of a counter.

The analogue-to-digital converter which is in the form of a sigma-delta structure and which satisfies all the requirements with respect to robustness, stability and favourable costs generates from the sensor signal a bit stream from which the digital high-pass filter removes the higher-value bits and thus any direct current portion in a manner which is absolutely offset-free. In spite of the low useful frequency a digital high-pass filter of this type can be integrated cheaply such that the evaluation circuit according to the invention is exceptionally suitable for being produced in the form of a system-integrated switching circuit.

BRIEF DESCRIPTION OF THE DRAWING

In the following the invention will be explained in further detail with reference to an embodiment and to the drawings, in which.

DETAILED DESCRIPTION OF PREFERRED EMBODIMENTS

Figure 1:
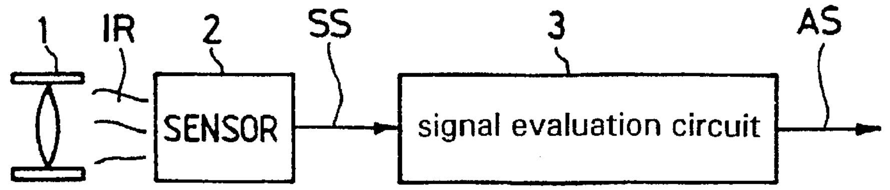
FIG. 1 shows a block diagram of a motion detector.

In FIG. 1 a passive infrared motion detector which as is known responds to the radiation from a human body which is in the far-infrared range and contrasts with the radiation of heat from the environment is shown as an example of a motion detector in accordance with the invention. However neither the detection principle employed (passive infrared radiation) nor the type of sensor (for example a pyrosensor) is to be understood in a restrictive manner. On the contrary the present signal evaluation circuit is suitable for all types of motion detectors whose sensor signal comprises a large direct current portion and a small alternating current portion.

The passive infrared motion detector of FIG. 1 contains a lens system 1, a sensor element 2 and a signal evaluation circuit 3 as the main components. The sensor element 2 is bombarded via the lens system 1 with infrared radiation IR from the space to be monitored and in dependence on the level of the impinging radiation emits an electrical signal SS known in the following as a sensor signal. This signal is delivered to the signal evaluation circuit 3 at whose output an alarm signal AS can be obtained if the sensor signal SS is correspondingly large. The cited main components of the infrared motion detector are preferably disposed in a common housing which is secured to a wall or at some other suitable location in the space to be monitored.

Figure 2:
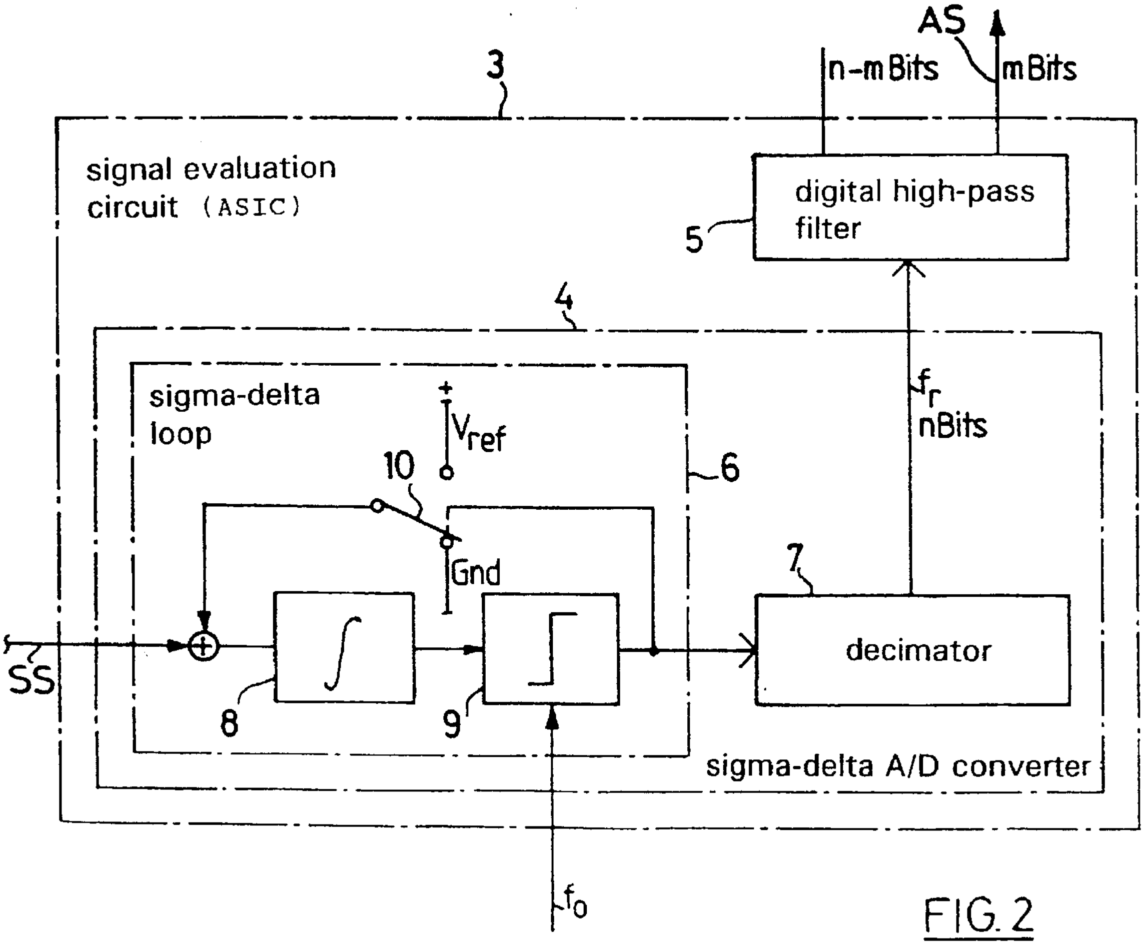
FIG. 2 shows a block diagram of the signal evaluation circuit of the detector of FIG. 1.

In the following the signal evaluation circuit will now be described with reference to FIG. 2. This circuit is in the form of a system-integrated switching circuit (ASIC) and as shown comprises two main blocks, namely an analogue-to-digital converter 4 and a digital high-pass filter 5. The analogue-to-digital converter 4 is a so-called sigma-delta converter and contains a sigma-delta loop 6 and a decimator 7 which is preferably in the form of a simple counter. The sigma-delta loop 6 in turn comprises an integrator 8, preferably formed by an operational amplifier, a comparator 9 and a 1 bit digital-to-analogue convertor 10 which is clocked by the output signal of the comparator 9 and which optionally feeds back to the integrator 8 a reference voltage $V_{ref}$ or a voltage Gnd (=ground) having the value zero.

The sensor signal SS delivered to the ASIC 3 contains as the main component an intensely dispersing and temperature-dependent direct current component of approximately 1 V on which an alternating current signal of 1 mV is superimposed which forms the actual useful signal and whose frequency lies in the range of from 0.2 to 10 Hz. This useful signal has to be amplified in the ASIC by a factor of between one hundred and one thousand for example. The sensor signal SS is integrated in the integrator 8 whose output signal is compared with a threshold value in the comparator 9. The comparator 9 is either clocked at a clock frequency $f_0$ as shown in the Figure or contains a clocked flipflop (a so-called D-FF) connected downstream. The clock frequency $f_0$ is also the frequency at which the sigma-delta loop 6 operates.

The output signal of the comparator 9 is firstly delivered to the decimator 7 and then clocks the 1 bit digital-to-analogue converter 10 which is formed by a switch and which is switched over between the reference voltage $V_{ref}$ delivered by a voltage source and the voltage Gnd. Thus the voltage source supplying the reference voltage $V_{ref}$ is preferably also used for feeding the sensor 2 (FIG. 1). By virtue of the 1 bit digital-to-analogue convertor 10 the integrated sensor signal SS is only considered in the range between the voltages Gnd and $V_{ref}$ in the comparator 9.

The signal delivered to the decimator 7 is in the form of a bit stream which means that its average value is pulse-density modulated and therefore represents the analogue input signal. This bit stream is accumulated in the decimator 7 in a parallel word having a given width. When the sigma-delta loop 6 operates at the frequency $f_0$ and the width of the parallel word is equal to n bits, this parallel word is available for all $f_r=f_0/2^n$, $f_r$ being the actual scanning rate of the sensor signal. If $f_0$ is 500 kHz and the parallel word is 14 bits wide for example, then the following applies for $f_r$: $f_r$=500 kHz/$2^{14}$=30.5 Hz.

After the counter the digitized sensor signal reaches the high-pass filter 5 which is a filter of the first order and removes all the direct current portions from the sensor signal in an offset-free manner. The high-pass filter 5 whose corner frequency for example can be approximately 70 mHz is designed in such a way that not all the n bits of the original parallel word are further processed but only a number m of the lower-value bits of the original n-bit parallel word. The result thereof is a digital amplification of $2^{n-m}$ which together with the amplification of the analogue integrator 8 gives the total amplification of the evaluation circuit 3. Thus m=8 for example gives a digital amplification of 64 whereby together with an amplification of 16 in the analogue integrator the initially mentioned total amplification of approximately 1000 is attained.

For the further processing of the output signal of the high-pass filter 5 a digital threshold is formed on the amplified signal present in the form of a word having m bits. When the signal exceeds this digital threshold a timer is triggered which activates a directly connected relay or an optical display, for example a light-emitting diode, for a given amount of time.

I claim:

1. A signal evaluation circuit for a motion detector in which an output signal from an infrared sensor has a relatively large direct current component and a small alternating current component, comprising:

an analog-to-digital converter for digitizing the sensor signal to form a digitized signal;

a digital high-pass filter operatively coupled to the analog-to-digital converter for filtering out the direct current component from the digitized signal; and an amplifier operatively coupled to the digital high-pass filter for amplifying the alternating current component.

2. The signal evaluation circuit according to claim 1, wherein the analog-to-digital converter comprises a sigma-delta structure.

3. The signal evaluation circuit according to claim 2, wherein the sigma-delta structure comprises a sigma-delta loop and a decimator operatively coupled to an output of the sigma-delta loop.

4. The signal evaluation circuit according to claim 3, wherein the decimator comprises a counter.

5. The signal evaluation circuit according to claim 3 or 4, wherein the sigma-delta loop comprises:

an integrator;

a comparator connected to an output of the integrator; and a 1-bit digital-to-analog converter operatively coupled to an output of the comparator, for being clocked by an output signal from the comparator, and for optionally feeding back to the integrator one of two voltages, thereby to establish a range for an integrator output signal.

6. The signal evaluation circuit according to claim 5, wherein the integrator comprises an operational amplifier.

7. The signal evaluation circuit according to claim 3 or 4, wherein the decimator comprises an accumulator for accumulating output signal bits from the sigma-delta loop in a parallel word having a preset width.

8. The signal evaluation circuit according to claim 7, wherein the digital high-pass filter comprises a discriminator for choosing from the parallel word a reduced word which comprises a reduced number of lowest bits of the parallel word.

9. The signal evaluation circuit according to claim 8, wherein the discriminator comprises means for triggering an alarm when a signal represented by the reduced word exceeds a threshold.

10. A signal evaluation circuit for a motion detector in which an output signal from a motion sensor has a relatively large direct current component and a small alternating current component, comprising:

an analog-to-digital converter comprising a sigma-delta structure, for digitizing the sensor signal to form a digitized signal;

a digital high-pass filter operatively coupled to the analog-to-digital converter for filtering out the direct current component from the digitized signal; and an amplifier operatively coupled to the digital high-pass filter for amplifying the alternating current component.

11. The signal evaluation circuit according to claim 10, wherein the sigma-delta structure comprises a sigma-delta loop and a decimator operatively coupled to an output of the sigma-delta loop.

12. The signal evaluation circuit according to claim 11, wherein the decimator comprises a counter.

13. The signal evaluation circuit according to claim 10 or 11, wherein the sigma-delta loop comprises:

an integrator;

a comparator connected to an output of the integrator; and a 1-bit digital-to-analog converter operatively coupled to an output of the comparator, for being clocked by an output signal from the comparator, and for optionally feeding back to the integrator one of two voltages, thereby to establish a range for an integrator output signal.

14. The signal evaluation circuit according to claim 13, wherein the integrator comprises an operational amplifier.

15. The signal evaluation circuit according to claim 10 or 11, wherein the decimator comprises an accumulator for accumulating output signal bits from the sigma-delta loop in a parallel word having a preset width.

16. The signal evaluation circuit according to claim 15, wherein the digital high-pass filter comprises a discriminator for choosing from the parallel word a reduced word which comprises a reduced number of lowest bits of the parallel word.

17. The signal evaluation circuit according to claim 16, wherein the discriminator comprises means for triggering an alarm when a signal represented by the reduced word exceeds a threshold.

* * * * *